United States Patent
Asahina et al.

[11] Patent Number: 5,949,468
[45] Date of Patent: Sep. 7, 1999

[54] LIGHT QUANTITY MEASURING SYSTEM AND EXPOSURE APPARATUS USING THE SAME

[75] Inventors: Tsutomu Asahina, Kodaira; Naoto Sano, Utsunomiya, both of Japan

[73] Assignee: Canon Kabushiki Kaisha, Tokyo, Japan

[21] Appl. No.: 08/677,525

[22] Filed: Jul. 10, 1996

[30] Foreign Application Priority Data

Jul. 17, 1995 [JP] Japan ................................. 7-180072

[51] Int. Cl.⁶ ............................................ B41J 2/47
[52] U.S. Cl. .................................................. 347/246
[58] Field of Search ........................... 347/246, 256, 347/257, 258, 259, 260, 261, 241, 236, 243

[56] References Cited

U.S. PATENT DOCUMENTS

| | | | |
|---|---|---|---|
| 3,823,318 | 7/1974 | Krause | 250/214 P |
| 4,519,692 | 5/1985 | Michalik | 396/48 |
| 4,711,568 | 12/1987 | Torigoe et al. | 355/68 |
| 4,727,381 | 2/1988 | Bille et al. | 347/256 |
| 4,804,978 | 2/1989 | Tracy | 347/246 |
| 4,822,975 | 4/1989 | Torigoe | 219/121.85 |
| 4,884,101 | 11/1989 | Tanimoto | 355/68 |
| 4,947,047 | 8/1990 | Muraki | 250/492.2 |
| 4,970,546 | 11/1990 | Suzuki et al. | 355/53 |
| 4,974,919 | 12/1990 | Muraki et al. | 359/204 |
| 5,053,614 | 10/1991 | Yui et al. | 250/205 |
| 5,107,275 | 4/1992 | Tsuruoka et al. | 347/247 |
| 5,119,390 | 6/1992 | Ohmori | 372/25 |
| 5,121,160 | 6/1992 | Sano et al. | 355/53 |
| 5,171,965 | 12/1992 | Suzuki et al. | 219/121.6 |
| 5,191,374 | 3/1993 | Hazama et al. | 355/43 |
| 5,250,797 | 10/1993 | Sano et al. | 250/205 |
| 5,475,491 | 12/1995 | Shiozawa | 356/394 |
| 5,491,534 | 2/1996 | Shiozawa | 347/246 |
| 5,574,492 | 11/1996 | Suzuki | 347/256 |

FOREIGN PATENT DOCUMENTS

| | | |
|---|---|---|
| 61-97830 | 5/1986 | Japan . |
| 4-69660 | 3/1992 | Japan . |
| 5-62876 | 3/1993 | Japan . |
| 6-119971 | 4/1994 | Japan . |

*Primary Examiner*—N. Le
*Assistant Examiner*—L. Anderson
*Attorney, Agent, or Firm*—Fitzpatrick, Cella, Harper & Scinto

[57] ABSTRACT

A light quantity measuring system and an exposure apparatus using the same, wherein the measuring system includes a light intensity measuring device having a plurality of light receiving elements arrayed at least along a scan direction, a scanning mechanism for scanningly moving the light intensity measuring device relative to a particular region to be examined, and a storing device for storing an intensity of light of each light receiving element, as successively received by the light receiving elements as the light intensity measuring device is scanningly moved relative to the particular region. The light quantity is measured on the basis of information stored in the storing device.

23 Claims, 7 Drawing Sheets

LIGHT QUANTITY MEASURING SYSTEM AND EXPOSURE APPARATUS USING THE SAME

FIELD OF THE INVENTION AND RELATED ART

This invention relates to a light quantity measuring system and, more particularly, to a scan type exposure exposure apparatus using such a light quantity measuring system to measure an exposure amount distribution in an exposure region of one shot to assure correct exposure of a wafer.

Photolithographic processes for the manufacture of semiconductor devices use a projection exposure apparatus by which a pattern of a reticle is transferred through a projection optical system onto a wafer which is coated with a resist. A chip pattern per one semiconductor device is increasing in size and decreasing in linewidth. Thus, exposure apparatuses having a larger exposure region and a higher resolution have been desired.

In order to meet the requirement of a larger exposure region, there has been developed a scanning type exposure apparatus wherein a reticle and a wafer are scanned in a timed relation relative to a slit-like illumination region by which a pattern of the reticle larger than the illumination region is transferred to the wafer.

On the other hand, higher resolution is provided by shortening the wavelength of a light source. In place of a Hg lamp having been conventionally used, an excimer laser is going to be used. An excimer laser provides a high power in the deep ultraviolet region, but, as contrasted to conventional light sources, it is a pulse light emission type laser.

In a scan type exposure apparatus having a pulse laser such as an excimer laser as a light source, the exposure amount distribution in the exposure region along the scan direction changes for various factors such as a variation in the output of the light source, a shift of light emission timing or positional deviation of a stage, for example. It is, therefore, important in a scan type exposure apparatus to measure the exposure amount distribution along the scan direction, to control the exposure amount of a wafer on the basis of the measurement and to thereby suppress the non-uniformness of exposure in the exposure region.

The exposure amount may be measured in a scan type exposure apparatus by using an illuminometer having been used in conventional steppers. Such an illuminometer is a detector for detecting light intensity, having a small opening at its light receiving portion. It is so mounted on a wafer stage that the light receiving portion is disposed at the same level (height) as the wafer surface.

By scanning and exposing this illuminometer once, the exposure amount in one small region can be measured. Then, the illuminometer is displaced to another position in the scan direction, and the scan exposure is repeated to measure the exposure amount. By repeating this operation, exposure amounts of matrix or linear small regions can be measured.

Since, however, an excimer laser has a variation in output per pulse, the exposure amount in a certain small region changes per scan exposure. In the method described above, the scan exposure is repeated in the measurement of exposure amount. Thus, with this method, it is not possible to measure the exposure amount distribution in the exposure region.

SUMMARY OF THE INVENTION

It is accordingly an object of the present invention to provide a light quantity measuring system or a scan type exposure apparatus using the same, by which an exposure amount distribution on a wafer can be measured accurately.

In accordance with an aspect of the present invention, there is provided a light quantity measuring system, comprising: light intensity measuring means having plural light receiving elements arrayed at least along a scan direction; scanning means for relatively scanningly moving said light intensity measuring means relative to a particular region to be examined; and storing means for storing an intensity of light of each light receiving element, as successively received by said light receiving elements as said light intensity measuring means is relatively scanningly moved relative to the particular region, wherein the light quantity is measured on the basis of information stored in said storing means.

In accordance with another aspect of the present invention, there is provided a method of detecting dispersion in sensitivity of plural light receiving elements arrayed at least along a scan direction, said method comprising: relatively scanningly moving the light receiving elements relative to an illumination region; applying the same quantity of light to the light receiving elements; and comparing outputs of the light receiving elements responsive to the application of the light with each other, to determine dispersion in sensitivity of the light receiving elements.

In accordance with a further aspect of the present invention, there is provided an exposure apparatus, comprising: a light source; scanning means for relatively scanningly moving an illumination region defined by light from said light source, relative to a mask and a wafer, wherein said scanning means is arranged to relatively scan the mask and the wafer in a timed relation to illuminate a particular region on the mask and the wafer wider than the illumination region, whereby a pattern of the mask is lithographically transferred to the wafer; and exposure amount distribution measuring means for measuring an exposure amount distribution on the wafer.

In accordance with yet a further aspect of the present invention, there is provided an exposure apparatus, comprising: a light source for providing pulse light; scanning means for relatively scanningly moving illumination regions successively defined by light pulses from said light source, relatively to a mask and a wafer; wherein said scanning means is arranged to relatively scan the mask and the wafer in a timed relation so that the illumination regions are relatively displaced on the mask and the wafer and are partially superposed on the mask and the wafer, whereby a particular region on the mask and the wafer wider than the illumination region is illuminated such that a pattern of the mask is lithographically transferred to the wafer; light intensity measuring means having plural light receiving elements arrayed at least along a scan direction; and storing means for storing an intensity of light of each light receiving element, as successively received by said light receiving elements as said light intensity measuring means is relatively scanningly moved relative to the illumination region, wherein an exposure amount distribution in the particular region is determined on the basis of information stored in said storing means.

In accordance with still a further aspect of the present invention, there is provided an exposure apparatus, comprising: a light source for providing pulse light; scanning means for relatively scanningly moving illumination regions successively by light pulses from said light source, relative to a mask and a wafer; wherein said scanning means is arranged to relatively scan the mask and the wafer in a timed relation so that the illumination regions are relatively displaced on the mask and the wafer and are partially superposed on the mask and the wafer, whereby a particular region on the mask and the wafer wider than the illumination region is illuminated such that a pattern of the mask is lithographically transferred to the wafer; light intensity measuring means having plural light receiving elements arrayed at least along a scan direction; and storing means for illuminating said light intensity measuring means as the same is held stationary relative to the illumination region, and for storing an intensity of light of each light receiving element, as successively received by said light receiving elements; wherein the light intensity distributions corresponding to the light pulses and being stored in said storing means are integrated with a shift corresponding to the amount of relative displacement of the illumination regions during an actual exposure process, to determine an exposure amount distribution in the particular region.

In accordance with yet a further aspect of the present invention, there is provided a device manufacturing method, comprising the steps of: relatively scanningly moving illumination regions successively defined by light pulses from a pulse light source, relatively to a mask and a wafer; relatively scanning the mask and the wafer in a timed relation so that the illumination regions are relatively displaced on the mask and the wafer and are partially superposed on the mask and the wafer, whereby a particular region on the mask and the wafer wider than the illumination region is illuminated such that a pattern of the mask is lithographically transferred to the wafer; illuminating light intensity measuring means having plural light receiving elements arrayed at least along a scan direction, while relatively scanningly moving the light intensity measuring means relative to the illumination region; storing an intensity of light of each light receiving element, as successively received by said light receiving elements; and determining an exposure amount distribution in the particular region on the basis of information stored.

In accordance with yet a further aspect of the present invention, there is provided a device manufacturing method, comprising: relatively scanningly moving illumination regions successively defined by light pulses from a pulse light source, relatively to a mask and a wafer; relatively scanning the mask and the wafer in a timed relation so that the illumination regions are relatively displaced on the mask and the wafer and are partially superposed on the mask and the wafer, whereby a particular region on the mask and the wafer wider than the illumination region is illuminated such that a pattern of the mask is lithographically transferred to the wafer; illuminating light intensity measuring means having plural light receiving elements arrayed at least along a scan direction, as the light intensity measuring means is held stationary relative to the illumination region; storing an means for storing intensity of light of each light receiving element, as successively received by the light receiving elements; and integrating the light intensity distributions corresponding to the light pulses and being stored, with a shift corresponding to the amount of relative displacement of the illumination regions during an actual exposure process, to determine an exposure amount distribution in the particular region.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
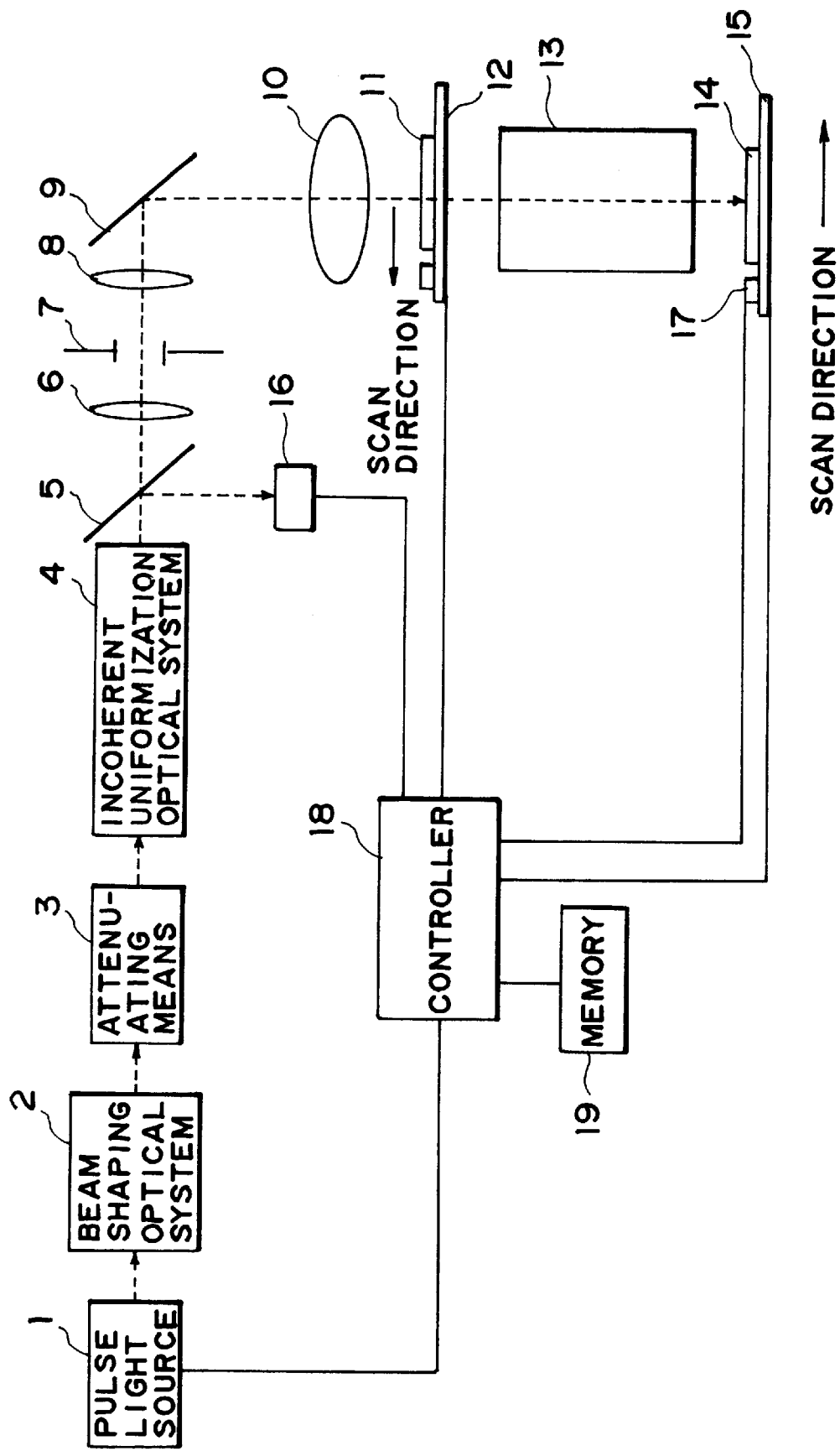
FIG. 1 is a schematic and diagrammatic view of a general structure of a scan type exposure apparatus to which the present invention is applied.

FIG. 1 is a schematic view of a scan type exposure apparatus according to an embodiment of the present invention. Denoted at 1 is a pulse light source such as an excimer laser, for example. Denoted at 2 is a beam shaping optical system such as a cylindrical lens or a beam expander, for example, for adjusting the beam shape of pulse light emitted by the pulse light source 1. Denoted at 3 is a light attenuating means such as an ND filter, for example, for adjusting the light quantity of pulse light from the pulse light source 1. Denoted at 4 is an incoherency-uniformization optical system for reducing the coherency of the pulse light from the pulse light source 1 so that a reticle 11 is illuminated uniformly.

Denoted at 5 is a beam splitter for directing a portion of pulse light to a detector 16, and it passes most of the received light. Denoted at 6 is a first relay lens for illuminating a field stop 7 uniformly. The field stop 7 is disposed in an optically conjugate relationship with the light receiving surface of a photodetector 16. The field stop 7 serves to restrict the light into a rectangular shape. Denoted at 8 is a second relay lens, and denoted at 9 is a mirror for bending the light path. Denoted at 10 is a condenser lens. The components denoted by 8, 9 and 10 function to illuminate the reticle 11 uniformly. The field stop 7 is disposed in an optically conjugate relationship with the reticle 11. The reticle 11 may have formed thereon a pattern which is to be transferred by an exposure process. In this embodiment, however, for measurement of a light intensity distribution in an illumination region and of an exposure amount distribution in an exposure region, a reticle without having such a pattern is placed on a reticle stage 12. Alternatively, the reticle 11 may be unloaded. Denoted at 13 is a projection lens for projecting a pattern of the reticle 11 onto a wafer 14 in a reduced scale.

Denoted at 15 is a wafer stage on which the wafer 14 is placed. Denoted at 17 is an illuminometer for measuring a light intensity distribution in an illumination region or an exposure amount distribution in an exposure region. The illuminometer 17 has a light receiving portion which comprises light receiving elements arrayed one-dimensionally along a scan direction. The illuminometer 17 is mounted on the wafer stage 15 so that the light receiving portion is placed at the same level (height) as the wafer surface. Denoted at 18 is a controller which receives outputs of the photodetector 16 and the illuminometer 17, and it serves to control the reticle stage 12 and the wafer stage 15 as well as to control the light emission timing of the pulse light source 1. Denoted at 19 is a memory for storing data of the controller 18.

Figure 2A:
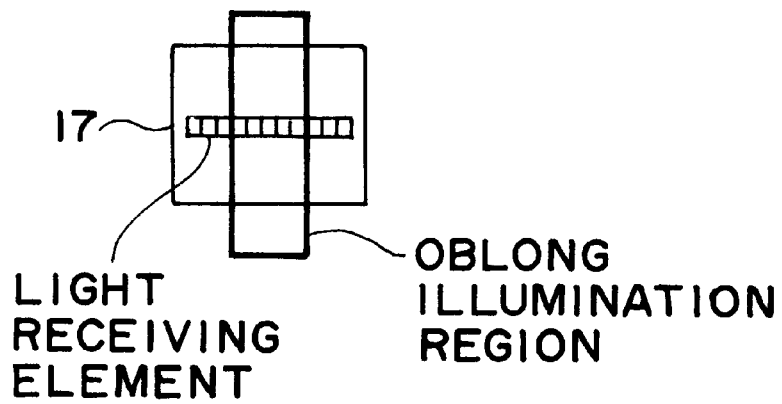
FIGS. 2A–2C are schematic views, respectively, for explaining measurement of a light intensity distribution in an illumination region and an exposure amount distribution in an exposure region.

For measurement of a light intensity distribution in an illumination region, with the arrangement described above, the controller 18 controls the position of the wafer stage 15 so that the width of the illumination region in the scan direction is covered by the light receiving elements of the illuminometer 17, as shown in FIG. 2A. Then, the pulse light source 1 is energized and pulse light is emitted. Sensitivity dispersion correction coefficients (to be described later) for the respective light receiving elements, having been stored in the memory 19, are read out and, by using them, the measured values of the light receiving elements are divided. By this, effects of sensitivity dispersion of the light receiving elements to their measured values are removed. In this manner, measured values of respective light receiving elements, arrayed in the scan direction, are obtained as a light intensity distribution in the illumination region along the scan direction. The light receiving elements are then moved in a direction perpendicular to the scan direction, and the above-described measurement operation is repeated. The measured values are divided by output dispersion correction coefficients, respectively, whereby a light intensity distribution over the whole illumination region is determined.

Figure 2B:
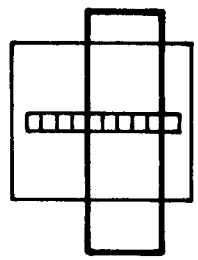
Figure 2C:
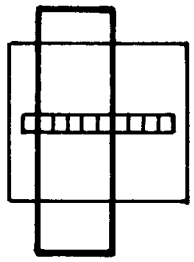

For measurement of an exposure amount distribution in the exposure region along the scan direction, the controller 18 controls the wafer stage 15 and stops the same at the scan start position, so that the width of the exposure region in the scan direction is covered by the light receiving elements of the illuminometer 17, as shown in FIG. 2B. The controller 18 then scanningly moves the wafer stage 15 and actuates the pulse light source 1 to emit light, such that an exposure process to the illuminometer 17 is performed. During this exposure process, successive outputs of each light receiving element responsive to successive light pulses are integrated. After completion of the exposure process (FIG. 2C), the sensitivity dispersion correction coefficients for respective light receiving elements, having been stored in the memory 19, are read out and, by using them, the measured values of respective light receiving elements are divided. By this, effects of sensitivity dispersion of the light receiving elements to their measured values are removed. In this manner, measured values of the light receiving elements arrayed along the scan direction are obtained, as an exposure amount distribution on the exposure region in the scan direction.

Now, the process of correcting sensitivity dispersion of light receiving elements of the illuminometer 17 will be explained.

This correction process comprises applying the same exposure amount to each of the light receiving elements and determining correction coefficients for sensitivity dispersion from differences in outputs of the light receiving elements. For application of the same exposure amount to the light receiving elements, pulse exposure may be performed at every displacement of the illuminometer 17 in the scan direction per pulse, which displacement corresponds to the product, multiplied by an integer, of the spacing of the light receiving elements and which is sufficiently smaller than the width of the illumination region in the scan direction. Alternatively, the pulse exposure may be performed at every displacement of the illuminometer, which displacement corresponds to a quotient, divided by an integer, of the spacing of the light receiving elements. Then, a variation in the output of the pulse light source is corrected, and an exposure amount provided by integrating the sectional light intensity in the scan direction of the illumination region is applied to each light receiving element.

Examples of the light receiving element may be a CCD line sensor or a photodiode array. In this embodiment, one having a length of 30 mm or more in the scan direction is used. Also, in order that the exposure amount distribution is resolved sufficiently, the spacing of the light receiving elements may be about 20 microns, and the width in a direction perpendicular to the scan direction may be about 20 microns.

Figure 3:
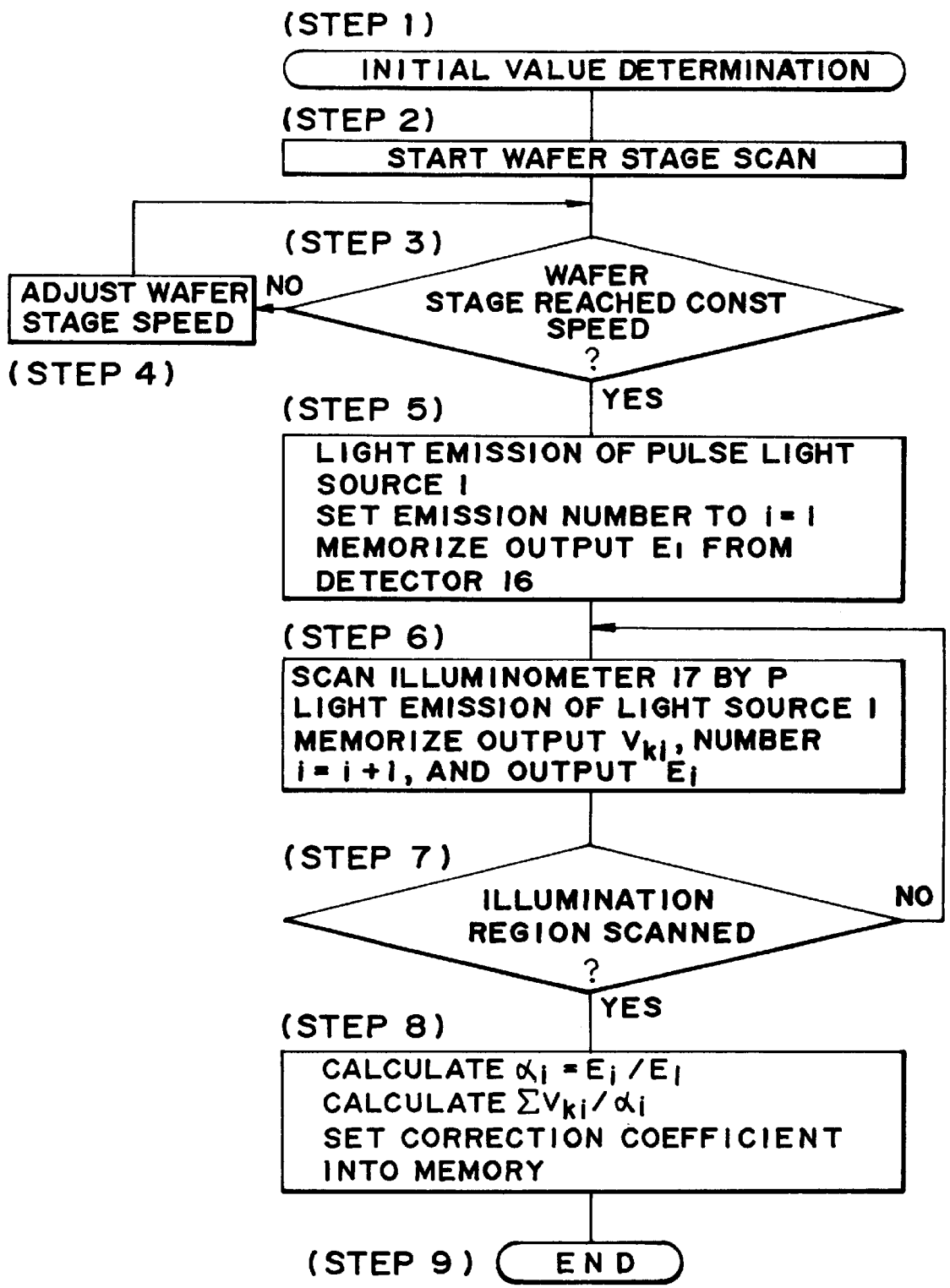
FIG. 3 is a flow chart for explaining a determination of a correction coefficient for dispersion in sensitivity of light receiving elements.

Referring now to the flow chart of FIG. 3 and the schematic views of FIGS. 4A and 4B, the procedure for determining correction coefficients for sensitivity dispersion of the light receiving elements in a case wherein the illuminometer 17 comprises light receiving elements of a number M and an element spacing p, will be explained.

Figure 4A:
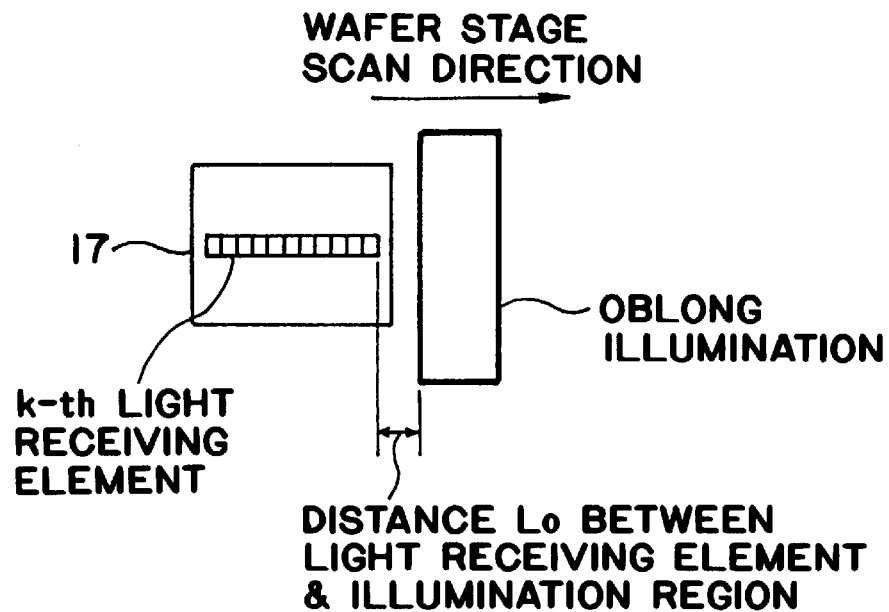
FIGS. 4A and 4B are schematic views, respectively, for explaining a determination of a correction coefficient for dispersion in sensitivity of light receiving elements.

At step 1, the illuminometer 17 is kept stopped so that all the light receiving elements are out of the illumination region, as shown in FIG. 4A. Then, initial values are determined. The initial values to be determined are (i) the distance $L_0$ from the first light receiving element to the illumination region; (ii) the distance P through which the illuminometer 17 is scanned during a period in which the pulse light source 1 emits one pulse; and (iii) the scanning distance L until all the light receiving elements pass the illumination region. Namely, the range of scan of the stage necessary for determination of the correction coefficients for the sensitivity dispersion of the light receiving elements as well as the scan condition are set.

The distance $L_0$ is a sufficient distance through which the wafer stage 15 having started the scan reaches a constant speed, and the distance P is a distance corresponding to the product, multiplied by an integer, or a quotient, divided by an integer, of the element spacing p.

At step 2, the controller 18 starts a scan of the wafer stage 15.

At step 3, a discrimination is made as to whether the wafer stage 15 has reached a constant speed. If not, the sequence goes to step 4. If the result is affirmative, the sequence goes to step 5.

At step 4, the speed is adjusted so that the wafer stage 15 reaches a desired speed.

At step 5, before the light receiving elements enter the illumination region, the controller 18 actuates the pulse light source 1 so as to emit a first light pulse. Here, the number (i) of light emissions of the pulse light source 1 is set to i=1, the number i being subsequently counted by the controller 18. Also, the output of the photodetector 16 which monitors a portion of the output of the pulse light source 1 is applied to the controller 18, and it is stored into the memory 19 as a measured value $E_1$.

At step 6, the illuminometer 17 is scanningly moved by a fixed distance P (corresponding to a product, multiplied by an integer, or to a quotient, divided by an integer, of the element spacing) as determined by the spacing p of the light receiving elements. Then, the pulse light source 1 emits a second light pulse. The outputs $V_{k2}$ of the light receiving elements (k is the ordinal number of each light receiving element, where $1 \leq k \leq M$) and the output $E_2$ of the photodetector 16 are applied to the controller 18, and they are memorized into the memory 19.

Thereafter, every time the illuminometer 17 is scanningly moved by the wafer stage 15 by a distance P, the pulse light source 1 is caused to emit one pulse (i is the number of emissions). The outputs $V_{ki}$ of the light receiving elements and the output $E_i$ of the photodetector 16 are applied to the controller 18. The outputs $V_{ki}$ and the number i of emissions as well as the output $E_i$ are memorized into the memory 19.

Figure 4B:
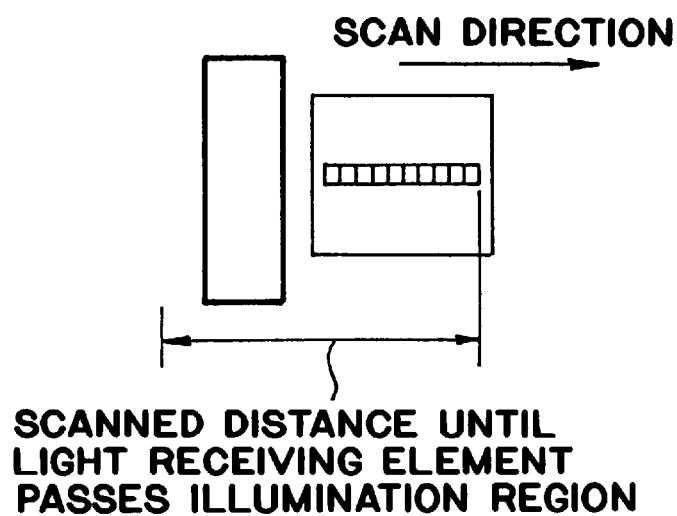

At step 7, if the wafer stage 15 has scanningly moved by the scanning distance L by which the light receiving elements pass the illumination region, as shown in FIG. 4B, the sequence goes to step 8.

At step 8, values $E_i$ and $V_{ki}$ are read out of the memory 19. Then, by using $E_1$ as a reference, correction coefficients $\alpha_i$ for dispersion in output of the pulse light source are determined, where $\alpha_i = E_i/E_1$. By dividing $V_{ki}$ by $\alpha_i$, a variation of $V_{ki}$ due to a dispersion in output of the pulse light source 1 is removed.

An integrated value of the outputs of a k-th light receiving element can be represented by $\Sigma(V_{ki}/\alpha_i)$. Here, $\Sigma(V_{ki}/\alpha_i)$ corresponds to an integrated value of sectional light intensity distributions in the illumination region in the scan direction. Integrated values $\Sigma(V_{1i}/\alpha_i), \ldots,$ and $\Sigma(V_{Mi}/\alpha_i)$ of the first to M-th light receiving elements, respectively, will be equal to each other provided that there is no dispersion in sensitivity in these light receiving elements. In other words, the differences among these integrated values $\Sigma(V_{ki}/\alpha_i)$ correspond to the sensitivity dispersion. For this reason, by standardizing, with respect to the integrated value $\Sigma(V_{1i}/\alpha_i)$ of the first (k=1) light receiving element, the integrated values of the other light receiving elements, respectively, correction coefficients $\beta k = \Sigma(V_{ki}/\alpha_i)\Sigma(V_{1i}/\alpha_i)$ can be determined. These correction coefficients are stored into the memory 19.

At step 9, the procedure of determining the correction coefficients is completed.

In this embodiment as described above, for a determination of the correction coefficients for sensitivity dispersion, the illuminometer 17 is scanningly moved and the measurement is performed. On the other hand, the correction coefficients for sensitivity dispersion of the line sensor may be determined by moving the illuminometer 17 by an amount corresponding to a product, multiplied by an integer, or a quotient, divided by an integer, of the element spacing, and executing the pulse exposure at the moment the illuminometer 17 is stopped. Also, plural exposures may be made at the position where the illuminometer is stopped, and an integrated exposure may be performed there. This is effective to average the effects due to a variation in output of the light source.

Figure 5:
FIG. 5 is a schematic view of an arcuate-shaped illumination region.
Figure 5:
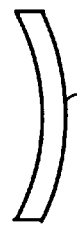

The length of the illumination region in a direction perpendicular to the scan direction is large, such as about 30 mm, for example. On the other hand, the width of each light receiving element of the illuminometer 17 in a direction perpendicular to the scan direction is very small, such as about 20 microns for example. This means that the illumination region on the wafer surface may have either a rectangular shape as shown in FIG. 2 or an arcuate shape such as shown in FIG. 5. Independently of the shape of the illumination region, the illuminance distribution and exposure amount distribution are measured.

In the embodiment described above, the length of the light receiving elements of the illuminometer 17 is made large (on the order of 30 mm or more) to cover the the exposure region in the scan direction. However, the length may be shortened (e.g., about 5 mm) to cover the length of the illumination region in the scan direction. Measurement of the exposure amount distribution is still attainable in such a case. That is, in this case, the illuminometer is not be scanned, but it is held stopped at a position where it covers the illumination region in the scan direction, and the measurement of an illuminance distribution in the illumination region responsive to the exposure is performed. Measured values of the outputs of the light receiving elements corresponding to successive light pulses are memorized. After completion of the exposure, the measured values corresponding to each pulse are integrated while being shifted by an amount corresponding to the number of elements, which corresponds to displacement of the wafer stage per one pulse emission an during actual exposure process. The exposure amount distribution can be determined also in this manner.

Figure 6A:
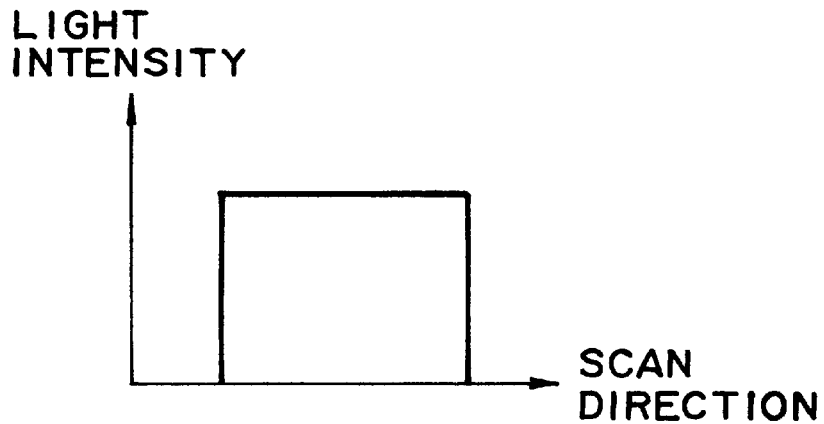
FIGS. 6A–6C are graphs for explaining examples of sectional light intensity distributions of an illumination region, in scan direction.
Figure 6B:
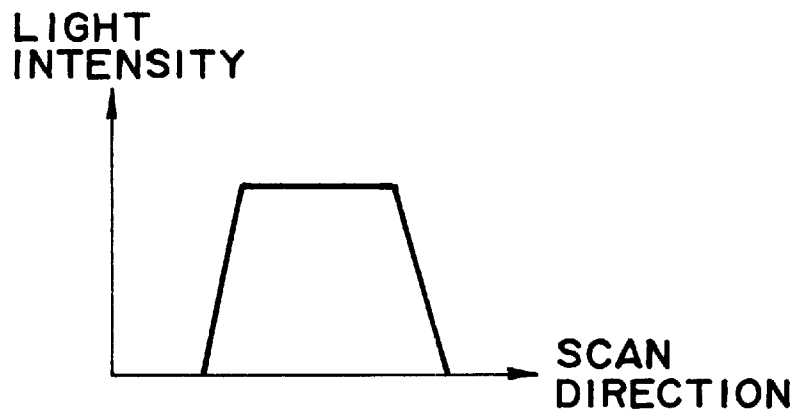
Figure 6C:
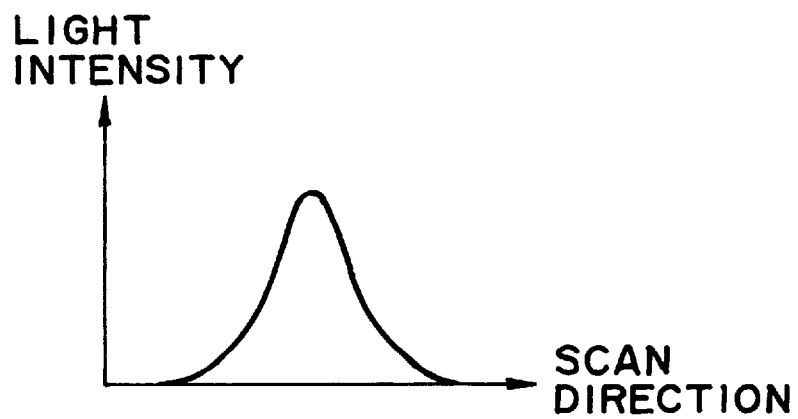

The width of the illumination region in the scan direction is about 5 mm. On the other hand, the width of each light receiving element of the illuminometer in the scan direction is very small, on the order of 20 microns. The sectional light intensity distribution in the illumination region along the scan direction may be rectangular (FIG. 6A), trapezoidal (FIG. 6B) or Gaussian (FIG. 6C). In any of these cases, a change in shape of the light distribution can be sufficiently solved. Independently of the shape of the sectional light intensity distribution in the illumination region in the scan direction, the light intensity distribution in the illumination region as well as the exposure amount distribution can still be measured.

While the embodiment described above uses a pulse light source as a light source, a continuous emission type light source such as a Hg lamp or a YAG laser may be used. On that occasion, by using the process of determining correction coefficients for sensitivity dispersion of light receiving elements and by using an illuminometer with a light receiving portion comprising one-dimensionally arrayed light receiving elements, it is possible to provide an exposure apparatus by which an exposure amount distribution in the exposure region can be measured without being affected by a variation in output of the light source.

Further, while the embodiment described above uses an illuminometer which comprises light receiving elements arrayed one-dimensionally along the scan direction, those light receiving elements arrayed two-dimensionally along the scan direction and a direction perpendicular to the scan direction, may be used. On that occasion, by using the process of correcting the sensitivity dispersion of the light receiving elements, it is possible to provide an exposure apparatus by which an exposure amount distribution in the exposure region can be measured substantially under the same conditions as those of an actual exposure process.

Next, an embodiment of a device manufacturing method, which uses an exposure apparatus such as shown in FIG. 1, will be described.

Figure 7:
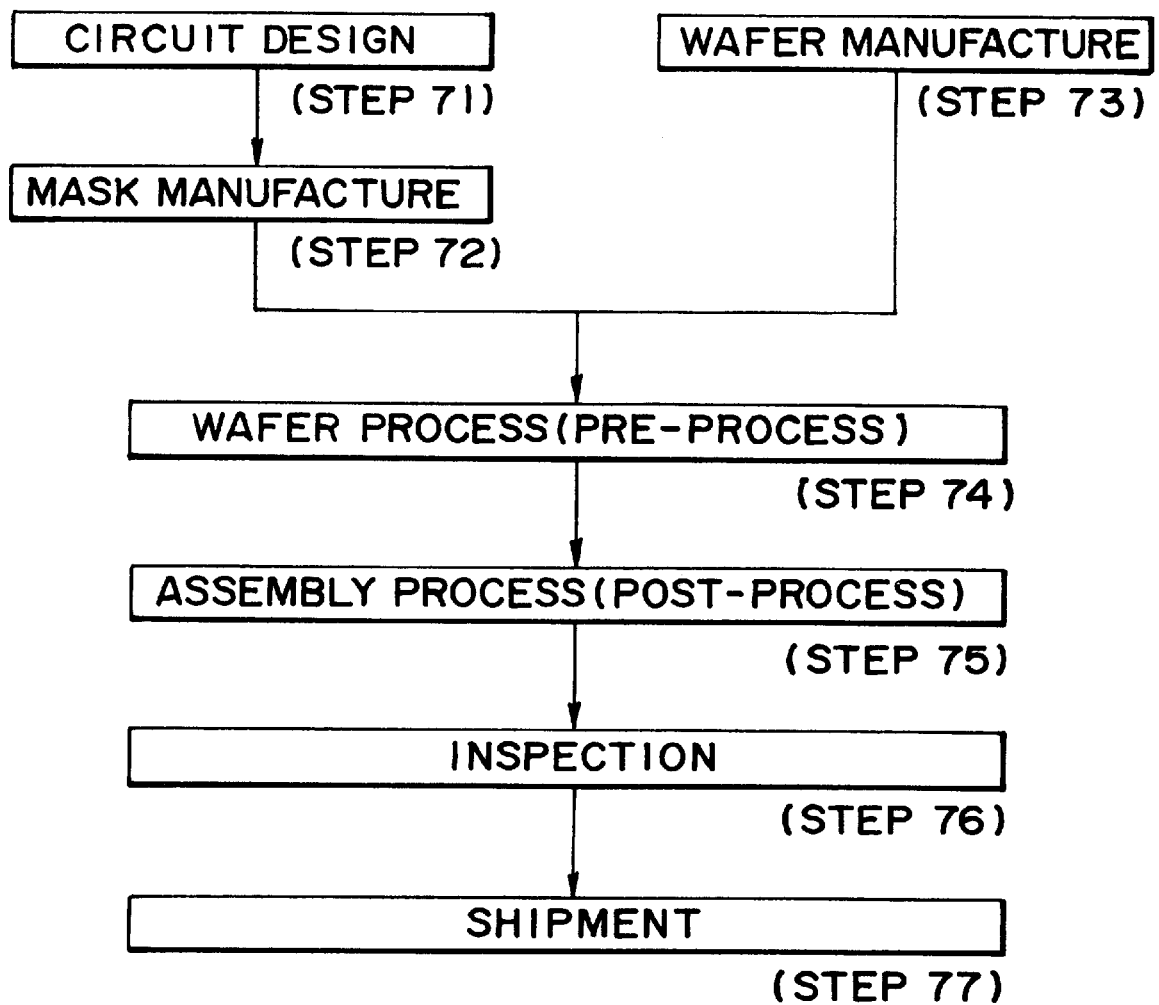
FIG. 7 is a flow chart for explaining semiconductor device manufacturing processes.

FIG. 7 is a flow chart of the sequence of manufacturing a semiconductor device such as a semiconductor chip (e.g., an IC or an LSI), a liquid crystal panel or a CCD, for example. Step 71 is a design process for designing the circuit of a semiconductor device. Step 72 is a process for manufacturing a mask (reticle 11) on the basis of the circuit pattern design. Step 73 is a process for manufacturing a wafer (wafer 14) by using a material such as silicon.

Step 74 is a wafer process, which is called a pre-process wherein, by using the so prepared mask and wafer, circuits are practically formed on the wafer through lithography. Step 75 subsequent to this is an assembling step, which is called a post-process wherein the wafer processed by step 74 is formed into semiconductor chips. This step includes assembling (dicing and bonding) and packaging (chip sealing). Step 76 is an inspection step wherein an operability check, a durability check and so on of the semiconductor devices produced by step 75 are carried out. With these processes, semiconductor devices are finished and they are shipped (step 77).

Figure 8:
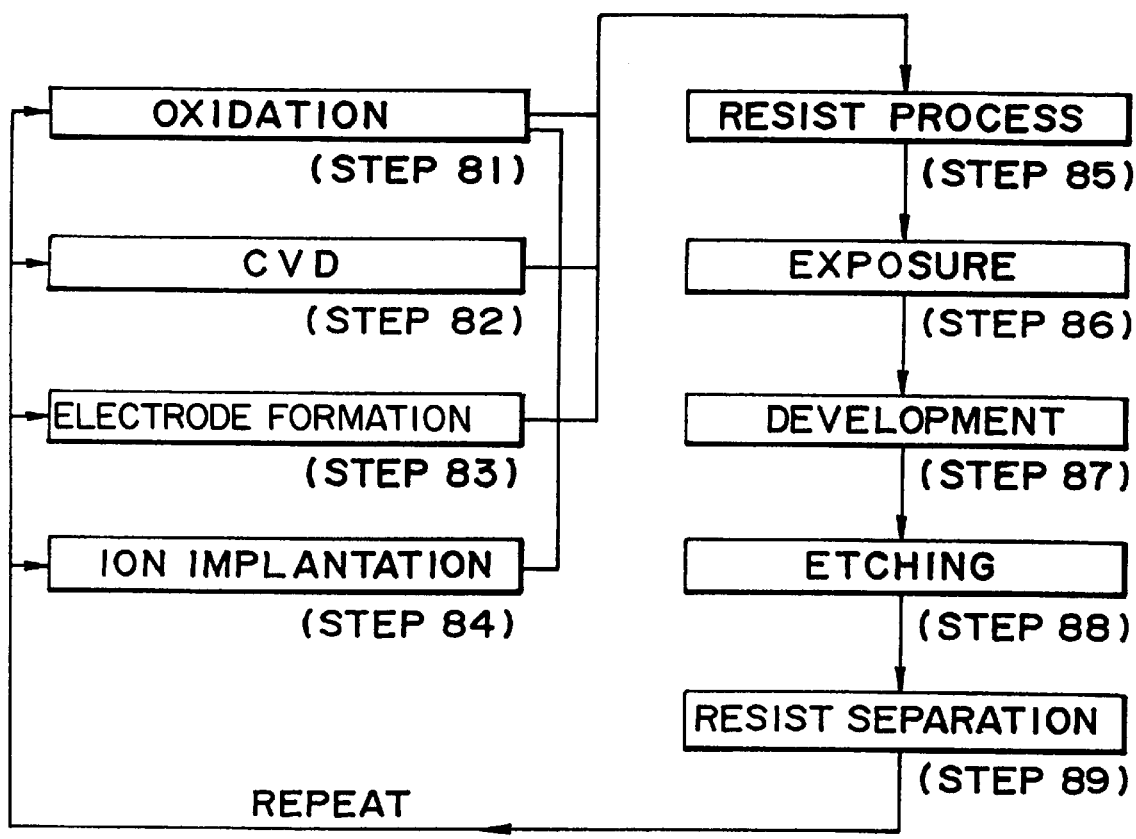
FIG. 8 is a flow chart for explaining details of a wafer process in the processes of FIG. 7.

FIG. 8 is a flow chart showing details of the wafer process. Step 81 is an oxidation process for oxidizing the surface of a wafer (wafer 14). Step 82 is a CVD process for forming an insulating film on the wafer surface. Step 83 is an electrode forming process for forming electrodes on the wafer by vapor deposition. Step 84 is an ion implanting process for implanting ions to the wafer. Step 85 is a resist process for applying a resist (photosensitive material) to the wafer. Step 86 is an exposure process for printing, by exposure, the circuit pattern of the mask (reticle 11) on the wafer through the exposure apparatus described above. Step 87 is a developing process for developing the exposed wafer. Step 88 is an etching process for removing portions other than the developed resist image. Step 89 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A light quantity measuring system, comprising:
    light intensity measuring means comprising a plurality of light receiving elements arrayed at least along a scan direction;
    scanning means for relatively scanningly moving said light intensity measuring means relative to an illumination region; and
    storing means for storing an intensity of light of each light receiving element, as successively received by said light receiving elements as said light intensity measuring means is relatively scanningly moved relative to the illumination region,
    wherein the light quantity distribution in a particular region to be examined is measured on the basis of information stored in said storing means.

2. A system according to claim 1, further comprising correcting means for correcting a dispersion in sensitivity of said light receiving elements.

3. A method of detecting a dispersion in sensitivity of a plurality of light receiving elements arrayed at least along a scan direction, said method comprising:
    relatively scanningly moving the light receiving elements relative to an illumination region;
    applying the same quantity of light to the light receiving elements; and
    comparing outputs of the light receiving elements, responsive to the application of the light, with each other, to determine a dispersion in sensitivity of the light receiving elements.

4. A method according to claim 3, further comprising defining the illumination region with pulse light, and relatively scanningly moving the light receiving elements relative to the illumination region so that the amount of displacement of the light receiving elements per one light pulse relative to the illumination region corresponds to a product, multiplied by an integer, of the spacing of the light receiving elements in the scan direction.

5. A method according to claim 3, further comprising defining the illumination region with pulse light, and relatively scanningly moving the light receiving elements relative to the illumination region so that the amount of displacement of the light receiving elements per one light pulse relative to the illumination region corresponds to a quotient, divided by an integer, of the spacing of the light receiving elements in the scan direction.

6. An exposure apparatus, comprising:
    a light source;
    scanning means for relatively scanningly moving an illumination region defined by light from said light source, relative to a mask and a wafer, wherein said scanning means is arranged to relatively scan the mask and the wafer in a timed relation to illuminate a particular region on the mask and the wafer wider than the illumination region, whereby a pattern of the mask is lithographically transferred to the wafer; and
    exposure amount distribution measuring means for measuring an exposure amount distribution in the particular region on the wafer.

7. An apparatus according to claim 6, wherein said exposure distribution measuring means comprises light intensity measuring means comprising a plurality of light receiving elements arrayed at least along a scan direction, and storing means for storing an intensity of light of each light receiving element, as successively received by said light receiving elements as said light intensity measuring means is relatively scanningly moved relative to the illumination region.

8. An apparatus according to claim 7, further comprising correcting means for correcting a dispersion in sensitivity of said light receiving elements.

9. An apparatus according to claim 7, wherein said light intensity measuring means comprises a one-dimensional line sensor.

10. An apparatus according to claim 7, wherein said light intensity measuring means comprises a two-dimensional area sensor.

11. An exposure apparatus, comprising:
    a light source for providing pulse light;
    scanning means for relatively scanningly moving illumination regions successively defined by light pulses from said light source, relative to a mask and a wafer, wherein said scanning means is arranged to relatively scan the mask and the wafer in a timed relation so that the illumination regions are relatively displaced on the mask and the wafer and are partially superposed on the mask and the wafer, whereby a particular region on the mask and the wafer wider than the illumination region is illuminated, such that a pattern of the mask is lithographically transferred to the wafer;
    light intensity measuring means comprising a plurality of light receiving elements arrayed at least along a scan direction; and
    storing means for storing an intensity of light of each light receiving element, as successively received by said light receiving elements as said light intensity measuring means is relatively scanningly moved relative to the illumination region,
    wherein an exposure amount distribution in the particular region is determined on the basis of information stored in said storing means.

12. An apparatus according to claim 11, further comprising correcting means for correcting a dispersion in sensitivity of said light receiving elements.

13. An apparatus according to claim 11, wherein said light intensity measuring means comprises a one-dimensional line sensor.

14. An apparatus according to claim 11, wherein said light intensity measuring means comprises a two-dimensional area sensor.

15. An exposure apparatus, comprising:

a light source for providing pulse light;

scanning means for relatively scanningly moving illumination regions successively defined by light pulses from said light source, relative to a mask and a wafer, wherein said scanning means is arranged to relatively scan the mask and the wafer in a timed relation so that the illumination regions are relatively displaced on the mask and the wafer and are partially superposed on the mask and the wafer, whereby a particular region on the mask and the wafer wider than the illumination region is illuminated, such that a pattern of the mask is lithographically transferred to the wafer;

light intensity measuring means comprising a plurality of light receiving elements arrayed at least along a scan direction; and storing means for illuminating said light intensity measuring means as said light intensity measuring means is held stationary relative to the illumination region, and for storing an intensity of light of each light receiving element, as successively received by said light receiving elements, wherein the light intensity distributions corresponding to the light pulses and being stored in said storing means are integrated with a shift corresponding to the amount of relative displacement of the illumination regions during an actual exposure process, to determine an exposure amount distribution in the particular region.

16. An apparatus according to claim 15, further comprising correcting means for correcting a dispersion in sensitivity of said light receiving elements.

17. An apparatus according to claim 16, wherein said light intensity measuring means comprises a one-dimensional line sensor.

18. An apparatus according to claim 16, wherein said light intensity measuring means comprises a two-dimensional area sensor.

19. A device manufacturing method, comprising the steps of:

relatively scanningly moving illumination regions successively defined by light pulses from a pulse light source, relative to a mask and a wafer;

relatively scanning the mask and the wafer in a timed relation so that the illumination regions are relatively displaced on the mask and the wafer and are partially superposed on the mask and the wafer, whereby a particular region on the mask and the wafer wider than the illumination region is illuminated, such that a pattern of the mask is lithographically transferred to the wafer;

illuminating light intensity measuring means having a plurality of light receiving elements arrayed at least along a scan direction, while relatively scanningly moving the light intensity measuring means relative to the illumination region;

storing an intensity of light of each light receiving element, as successively received by said light receiving elements; and determining an exposure amount distribution in the particular region on the basis of the information stored in said storing step.

20. A method according to claim 19, further comprising correcting a dispersion in sensitivity of the light receiving elements.

21. A device manufacturing method, comprising:

relatively scanningly moving illumination regions successively defined by light pulses from a pulse light source, relative to a mask and a wafer;

relatively scanning the mask and the wafer in a timed relation so that the illumination regions are relatively displaced on the mask and the wafer and are partially superposed on the mask and the wafer, whereby a particular region on the mask and the wafer wider than the illumination region is illuminated, such that a pattern of the mask is lithographically transferred to the wafer;

illuminating light intensity measuring means having a plurality of light receiving elements arrayed at least along a scan direction, as the light intensity measuring means is held stationary relative to the illumination region;

storing an intensity of light of each light receiving element, as successively received by the light receiving elements; and integrating the light intensity distributions corresponding to the light pulses and being stored, with a shift corresponding to the amount of relative displacement of the illumination regions during an actual exposure process, to determine an exposure amount distribution in the particular region.

22. A method according to claim 21, further comprising correcting a dispersion in sensitivity of the light receiving elements.

23. An exposure apparatus, comprising:

illumination means for emitting light;

scanning means for relatively scanningly moving an illumination region defined by the light emitted from said illumination means, relative to a mask and a wafer, wherein said scanning means relatively scans the mask and the wafer in a timed relation to illuminate a particular region on the mask and the wafer wider than the illumination region, whereby a pattern of the mask is lithographically transferred to the wafer; and exposure amount distribution measuring means for measuring an exposure amount distribution in the particular region on an image plane where the wafer is to be placed.

* * * * *

UNITED STATES PATENT AND TRADEMARK OFFICE
CERTIFICATE OF CORRECTION

PATENT NO. : 5,949,468

DATED : September 7, 1999

INVENTOR(S): TSUTOMU ASAHINA, ET AL.

It is certified that error appears in the above-identified patent and that said Letters Patent is hereby corrected as shown below:

ON THE COVER PAGE:
The following should be inserted: --[*] Notice: This patent issued on a continued prosecution application filed under 37 CFR 1.53(d), and is subject to the twenty year patent term provisions of 35 U.S.C. § 154(a)(2).--.

COLUMN 1:
Line 7, "exposure" (second occurrence) should be deleted.

COLUMN 2:
Line 65, "by" should read --defined by--.

COLUMN 3:
Line 21, "relatively" should read --relative--;

Line 50, "an" should be deleted; and
Line 51, "storing" should read --storing an--.

COLUMN 7,
Line 66, "be" should be deleted.

UNITED STATES PATENT AND TRADEMARK OFFICE
CERTIFICATE OF CORRECTION

PATENT NO. : 5,949,468

DATED : September 7, 1999

INVENTOR(S): TSUTOMU ASAHINA, ET AL.

It is certified that error appears in the above-identified patent and that said Letters Patent is hereby corrected as shown below:

COLUMN 8:
Line 10, "an during" should read --during an--.

Signed and Sealed this

Twentieth Day of March, 2001

Attest:

NICHOLAS P. GODICI

*Attesting Officer*     *Acting Director of the United States Patent and Trademark Office*